United States Patent
Cok

(10) Patent No.: US 7,432,187 B1
(45) Date of Patent: Oct. 7, 2008

(54) METHOD FOR IMPROVING CURRENT DISTRIBUTION OF A TRANSPARENT ELECTRODE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/748,150

(22) Filed: May 14, 2007

(51) Int. Cl.
*H01L 21/44* (2006.01)

(52) U.S. Cl. .............................. 438/609; 257/E31.099

(58) Field of Classification Search ................. 438/609; 257/E31.099, E31.105, E51.018, E25.032, 257/E25.019
See application file for complete search history.

(56) References Cited

U.S. PATENT DOCUMENTS

| | | | |
|---|---|---|---|
| 6,645,444 B2 | 11/2003 | Goldstein | |
| 6,812,637 B2 | 11/2004 | Cok | |
| 7,179,756 B2* | 2/2007 | Yamazaki et al. | ........... 438/780 |
| 2005/0163938 A1* | 7/2005 | Yamazaki et al. | ........... 427/554 |
| 2005/0270450 A1* | 12/2005 | Ahn et al. | .................... 349/114 |
| 2006/0003262 A1 | 1/2006 | Yang et al. | |
| 2006/0057502 A1* | 3/2006 | Okada et al. | ................. 430/313 |
| 2006/0073667 A1 | 4/2006 | Li et al. | |
| 2006/0091780 A1* | 5/2006 | Minami | ...................... 313/495 |
| 2006/0279679 A1* | 12/2006 | Fujisawa et al. | ............ 349/116 |

OTHER PUBLICATIONS

U.S. Appl. No. 11/179,186, filed Jul. 12, 2006, Cok.
U.S. Appl. No. 11/253,909, filed Oct. 18, 2005, Cok.

* cited by examiner

*Primary Examiner*—Thao P. Le
(74) *Attorney, Agent, or Firm*—Stephan H. Shaw

(57) ABSTRACT

A method for improving current distribution of a transparent electrode includes forming a transparent electrode over a substrate; and forming a first mask. First openings are formed in the first mask. The first mask is also located over the transparent electrode. A dispersion, including conductive precursor components, is formed and deposited over the first mask and through the first openings onto the transparent electrode. Upon removal of the first mask, the conductive precursor components of the dispersion are cured to form first patterned conductive areas having a first thickness on the transparent electrode.

20 Claims, 9 Drawing Sheets

METHOD FOR IMPROVING CURRENT DISTRIBUTION OF A TRANSPARENT ELECTRODE

FIELD OF THE INVENTION

The present invention relates to top-emitting light-emitting diode (LED) devices, and more particularly, to a method for improving current distribution in a transparent electrode.

BACKGROUND OF THE INVENTION

Light-emitting diodes (LEDs) are a promising technology for flat-panel displays and area illumination lamps and backlights. Applications of LED devices include active-matrix image displays, passive-matrix image displays, and area-lighting devices such as, for example, selective desktop lighting. Irrespective of the particular LED device configuration tailored to these broad fields of applications, all LEDs function on the same general principles. An electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward-biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The EL medium structure can be formed of a stack of sublayers that can include small molecule organic layers, polymer layers, or inorganic layers. Additional charge-control layers, for example hole-injection, electron-injection, hole-blocking, electron-blocking, hole-transport, electron-transport, and contact layers are known, may be employed for both organic and inorganic applications. Such layers and sublayers are known and understood by those skilled in the LED art.

Full-color LED devices may employ a variety of materials to emit different colors of light. In this arrangement, the LED device is patterned with different sets of materials, each set of materials associated with a particular color of light emitted. Each pixel in an active-matrix, full-color LED device typically employs each set of materials, for example to form a red, green, and blue sub-pixel. In an alternative arrangement, a single set of materials emitting broadband light may be deposited in continuous layers with arrays of differently colored filters employed to create a full-color LED device. In addition, black-matrix materials may be employed between the color filters in non-emissive areas of the LED device to absorb ambient light and thereby improve the contrast of the LED device. Such color filter and black-matrix materials are known in the art and are employed, for example, in the LCD industry. The contrast improvement possible by providing a black-matrix material between light-emitting areas of the LED device is limited by the relative size of the light-emitting areas and the areas between the light-emitting areas, i.e. the fill factor of the LED device.

The emitted light is directed towards an observer, or towards an object to be illuminated, through the light transmissive electrode. If the light transmissive electrode is between the substrate and the light-missive elements of the LED device, the device is called a bottom-emitting LED device. Conversely, if the light-transmissive electrode is not between the substrate and the light emissive elements, the device is referred to as a top-emitting LED device. The present invention is primarily directed to a top-emitting LED device.

In top-emitting LED devices, light is emitted through an upper electrode or top electrode, typically but not necessarily the cathode, which has to be sufficiently light transmissive, while the lower electrode(s) or bottom electrode(s), typically but not necessarily the anode, can be made of relatively thick and electrically conductive metal compositions which can be optically opaque. Because light is emitted through an electrode, it is important that the electrode through which light is emitted be sufficiently light transmissive to avoid absorbing the emitted light. Typical prior-art materials proposed for such electrodes include indium tin oxide (ITO) and very thin layers of metal, for example silver or aluminum or metal alloys including silver or aluminum. However, the current-carrying capacity of such electrodes is limited, thereby limiting the amount of power that can be supplied to the LED materials, and hence the amount of light that can be emitted from the light-emissive layers.

Referring to FIG. 11, a top-emitting LED device as suggested by the prior art is illustrated having a substrate 10 (reflective, transparent, or opaque). Over the substrate 10, a semiconducting layer is formed providing thin-film electronic components 30 for driving an LED. An interlayer insulating and planarizing layer 32 is formed over the thin-film electronic components 30 and a patterned reflective electrode 12 defining LED light-emissive elements is formed over the insulating layer 32. An inter-pixel insulating film 34 separates the elements of the patterned reflective electrode 12. One or more first layers 14 of light-emissive materials and any desired charge-control materials, are formed over the patterned reflective electrode 12. A transparent second electrode 16 is formed over the one or more first layers 14 of organic material to form an LED 11. A gap 19 separates the transparent second electrode 16 from an encapsulating cover 20. The encapsulating cover 20 is transparent and may be coated directly over the transparent electrode 16 so that no gap 19 exists. In some prior-art embodiments, the transparent electrode 12 may instead be at least partially transparent and/or light absorbing. Because suitable transparent conductors, for example ITO, have a limited conductivity, the current that may be passed through the organic layers 14 is limited and the uniformity of the light-emitting areas in an OLED device may be adversely affected by differences in current passed through various portions of the transparent conductor 16.

As taught in issued U.S. Pat. No. 6,812,637 entitled "OLED Display with Auxiliary Electrode" by Cok, an auxiliary electrode 70 may be provided between the light-emitting areas 24 of the LED to improve the conductivity of the transparent electrode 16 and enhance the current distribution to the LED. For example, a thick, patterned layer of aluminum or silver or other metals or metal alloys may be employed. However, the formation of the auxiliary electrode 70 is problematic. Sputtering through a shadow mask is difficult for large substrates due to thermal expansion and alignment problems of the shadow mask. Likewise, evaporative deposition of conductive materials such as metals requires high temperatures and suffers from the same mask problems. High temperatures may also destroy any temperature-sensitive underlying layers. The use of photolithography to pattern an auxiliary electrode may compromise the integrity of underlying layers, particularly for organic devices.

Co-pending, commonly assigned U.S. Ser. No. 11/179,186 filed 12 Jul. 2006 describes an organic light-emitting diode (OLED) device having an auxiliary electrode grid located above a transparent second electrode, providing spacing between the transparent second electrode and a cover. Co-pending, commonly assigned U.S. Ser. No. 11/253,909 filed 18 Aug. 2005 describes an organic light-emitting diode (OLED) device having an electrode with reflective and transparent portions in the light emissive area, the transparent portion being a relatively lower electrically conductive portion so that light emitted by the light-emitting organic layer passes through the transparent portion and the reflective portion being a relatively higher electrically conductive portion for reflecting emitted light. However, these disclosures do not address the robustness of any manufacturing process required to form patterned conductors in electrical contact with a transparent electrode and may suffer from the problems cited above. These disclosures are incorporated in their entirety by reference.

It is known in the prior art to form conductive traces using nanoparticles comprising, for example silver. The synthesis of such metallic nano-crystals is known. For example, U.S. Pat. No. 6,645,444 entitled, "Metal nanocrystals and synthesis thereof" describes a process for forming metal nanocrystals that involves complexing a metal ion and an organic ligand in a solvent and introducing a reducing agent to reduce a plurality of metal ions to form the metal nanocrystals associated with the organic ligand. The nanocrystals are optionally doped or alloyed with other metals.

US 2006/073667 entitled, "Stabilized silver nanoparticles and their use" describes a process comprising: reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles. The composition may be heated to form an electrically conductive layer comprising silver that may be employed in an electronic device. This disclosure describes sintering nanoparticles at a temperature of 120 C. However, applicants have demonstrated that the nanoparticles may have a relatively low conductivity when sintered at these temperatures. Applicants have determined through experimentation that compositions employing nanoparticles of 40 nm diameters are typically heated to 200 degrees C. or even 250 degrees C. to form adequately electrically conductive layers. Although lower temperatures may be employed with smaller-diameter particles, the sintering time tends to be longer. Moreover, the deposition and removal of any uncured composition may be difficult in the presence of any other environmentally sensitive materials. US 2006/073667 is hereby incorporated in its entirety by reference.

US 2006/0057502 entitled, "Method of forming a conductive wiring pattern by laser irradiation and a conductive wiring pattern" describes fine wirings made by a method having the steps of painting a board with a metal dispersion colloid including metal nanoparticles of 0.5 nm-200 nm diameters (preferably 1-30 nm), drying the metal dispersion colloid into a metal-suspension film, irradiating the metal-suspension film with a laser beam of 300 nm-550 nm wavelengths, depicting arbitrary patterns on the film with the laser beam, aggregating metal nanoparticles into larger conductive grains, washing the laser-irradiated film, eliminating unirradiated metal nanoparticles, and forming metallic wiring patterns built by the conductive grains on the board thus enabling an inexpensive apparatus to form fine arbitrary wiring patterns on boards without expensive photomasks, resists, exposure apparatus and etching apparatus. The method can make wirings also on plastic boards or low-melting-point glass boards that have poor resistance against heat and chemicals. US20060003262 similarly discloses a method of forming a pattern of electrical conductors on a substrate, wherein metal nanoparticles may be mixed with a light absorbing dye, and the mixture is then coated on the substrate. The pattern is formed on the coated substrate with laser light, and unannealed material is removed from the substrate. The disclosures of US 2006/0057502 and US 2006/003262 are hereby incorporated by reference herein in their entirety. Removing unannealed material can damage underlying sensitive materials in light-emissive areas. Commercial, patterned deposition methods, such as inkjet devices, may not provide the resolution necessary to avoid occluding light emission from a top-emitter LED device.

There is a need, therefore, for an improved method for providing increased conductivity to the transparent electrode of a top-emitting LED device that is scalable to large sizes, avoids heating materials in emissive locations to high temperatures, and avoids the use of chemical processes.

SUMMARY OF THE INVENTION

In accordance with one embodiment, the invention is directed towards a method for improving current distribution of a transparent electrode includes forming a transparent electrode over a substrate; and forming a first mask. First openings are formed in the first mask. The first mask is also located over the transparent electrode. A dispersion, including conductive precursor components, is formed and deposited over the first mask and through the first openings onto the transparent electrode. Upon removal of the first mask, the conductive precursor components of the dispersion are cured to form first patterned conductive areas having a first thickness on the transparent electrode.

ADVANTAGES

Various embodiments of the present invention have the advantage of improving the power distribution in a top-emitter LED device.

It will be understood that the figures are not to scale since the individual layers are too thin and the thickness differences of various layers too great to permit depiction to scale.

DETAILED DESCRIPTION OF THE INVENTION

Figure 1:
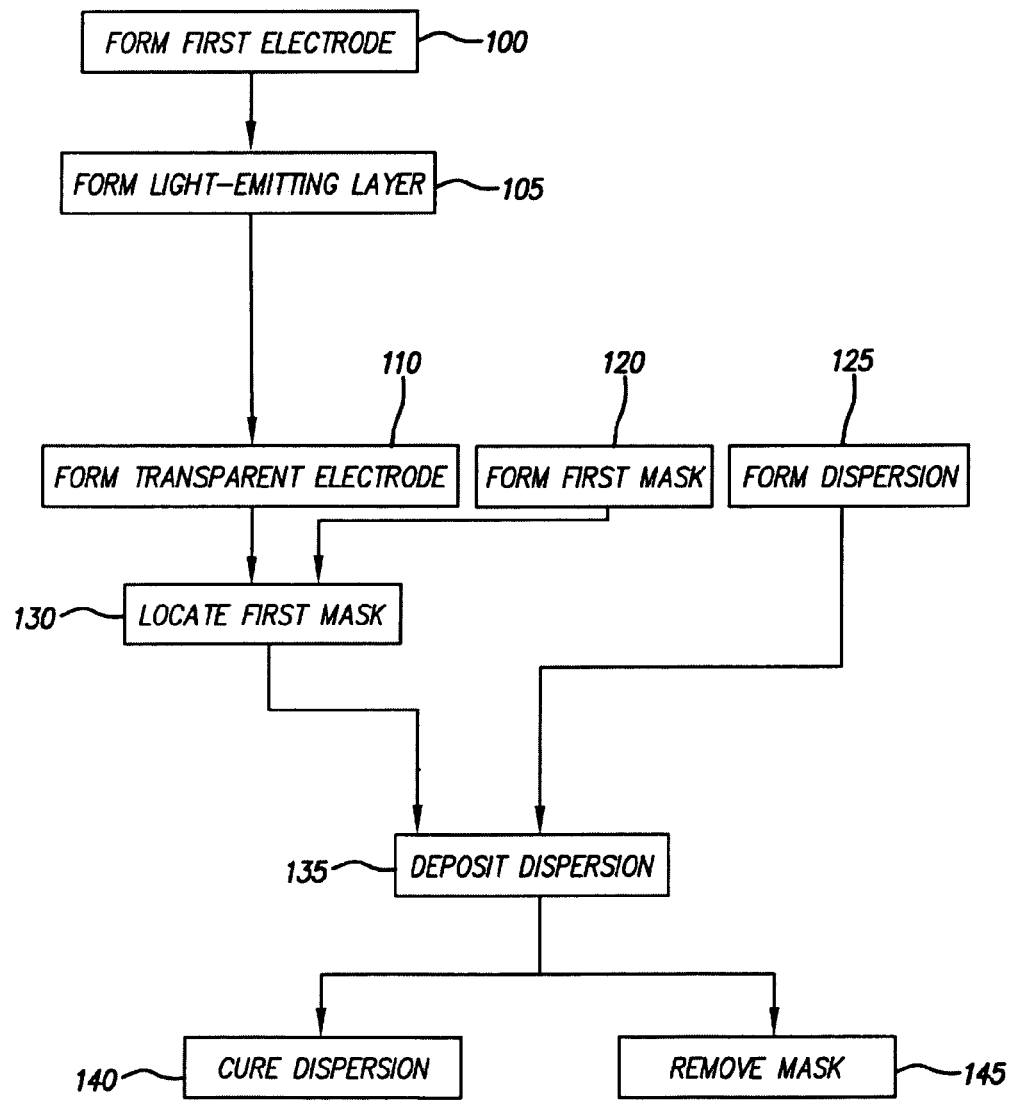
FIG. 1 is a flow diagram describing a method according to an embodiment of the present invention.

Referring to FIG. 1, a method for improving power distribution of a transparent electrode in a light-emitting diode (LED) device, comprises the steps of forming 100 a first electrode over a substrate, forming 105 one or more light-emissive layers, and forming 110 a transparent electrode on a substrate to make a light-emitting diode (LED). A first mask having first openings may be formed 120 before, after, or at the same time as the LED. Likewise, a dispersion containing conductive precursor components may be formed 125 before, after, or at the same time as the LED. The first mask is located 130 over the transparent electrode. The dispersion is deposited 135 over the first mask and through the first openings onto the transparent electrode. The first mask may be removed 145 and the dispersion cured 140 to form first patterned conductive areas having a first thickness on the transparent electrode.

Figure 2:
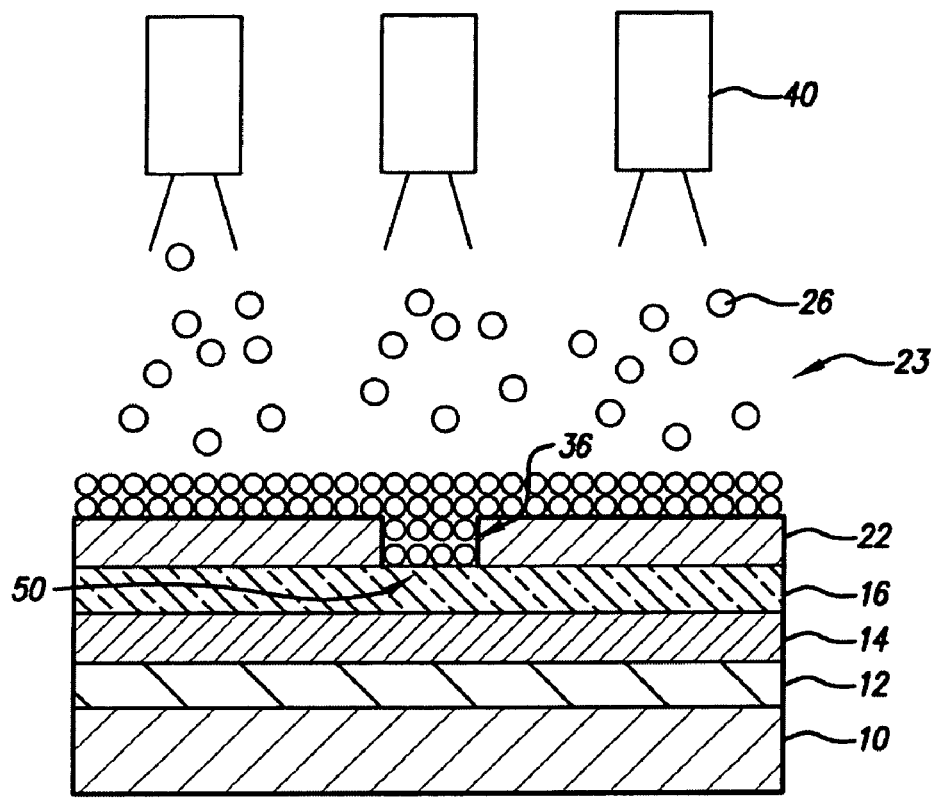
FIG. 2 is a partial cross section of a top-emitter LED device showing deposition according to an embodiment of the present invention.
Figure 3:
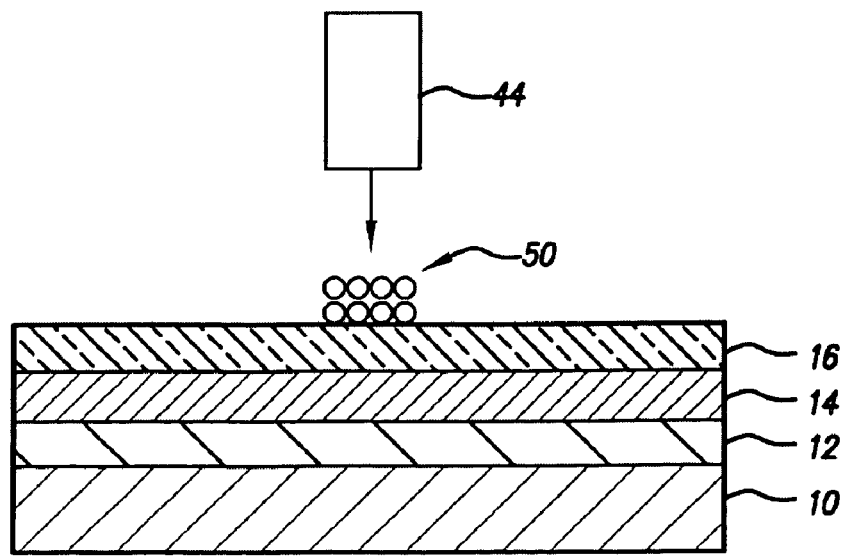
FIG. 3 is a partial cross section of a top-emitter LED device showing curing according to an embodiment of the present invention.
Figure 4:
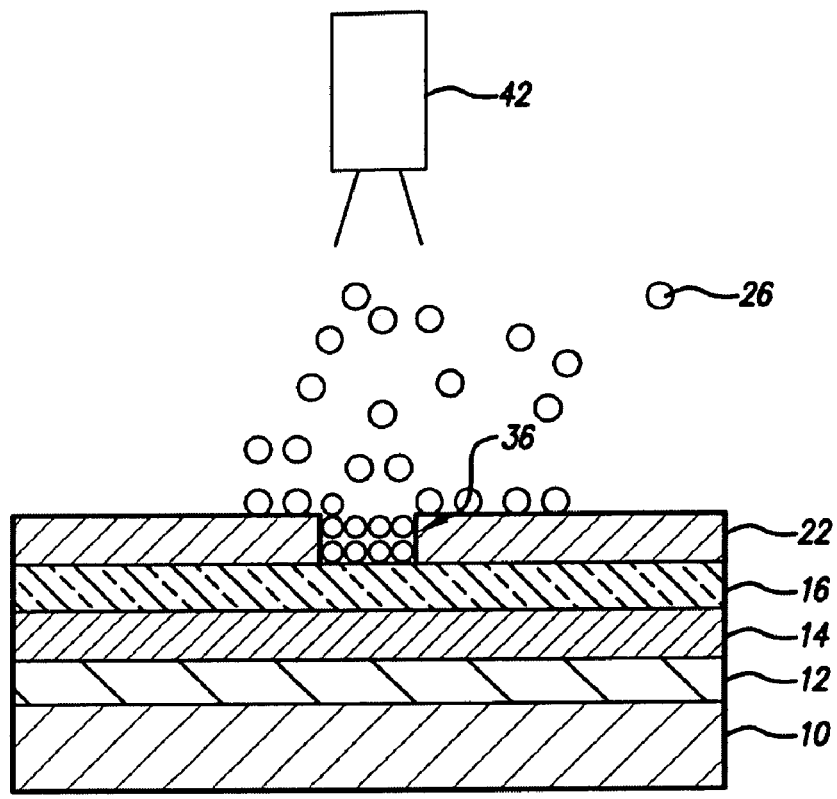
FIG. 4 is a partial cross section of a top-emitter LED device showing deposition according to an alternative embodiment of the present invention.
Figure 11:
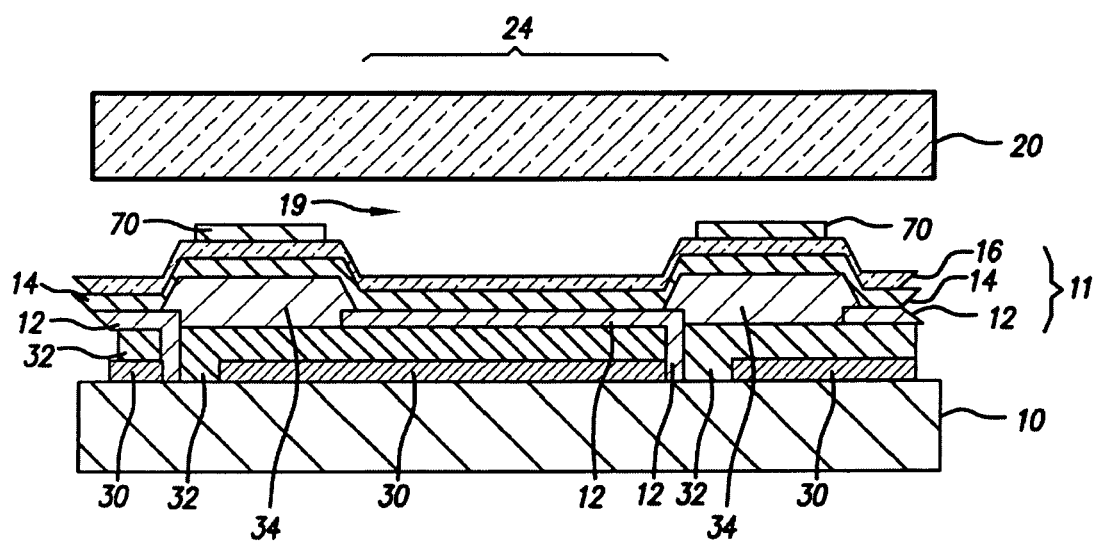
FIG. 11 is a partial cross section of a top-emitter OLED device having an auxiliary electrode as described in the prior art.

Referring to FIG. 2, an LED device made according to an embodiment of the present invention includes a substrate 10, first electrode 12 formed on the substrate 10, one or more layers of light-emissive and charge-control layers 14, and a second, transparent or semi-transparent electrode 16. A first mask 22 may be located over the transparent electrode 16 and a dispersion 23 deposited over the first mask 22. The dispersion 23 includes conductive precursor components 26, for example silver nano-particles in a solvent such as cyclohexane. The dispersion 23 may be deposited in a variety of ways, for example using one or more spray devices 40 (as shown), inkjet devices, slide devices, or hopper devices. The dispersion 23 is deposited on the transparent electrode 16 over the entire mask, or most of it, through the mask openings 36. Referring to FIG. 3, in a subsequent step the mask may (or may not) be removed and the conductive precursor particles 26 are cured by, for example patterned laser 44 heating, to form a patterned conductive area 50 on and in electrical contact with the transparent electrode 16 to improve its conductivity. In one embodiment of the present invention, the conductive areas are located between the light emissive areas 24 (as shown in FIG. 11). Alternatively, the conductive areas may be located in emissive areas 24. The conductive precursor components 26 may also be cured by employing a non-patterned method, for example by baking the entire device or by exposing it to unpatterned light. Since the dispersion is pattern-wise deposited through a mask, the result is a patterned conductive area. Referring to FIG. 4, the deposition may be done pattern-wise as well, for example by employing an inkjet deposition system 42. Such a patterned deposition may reduce dispersion waste by depositing materials only in the mask opening environs rather than over the mask in general.

Figure 5:
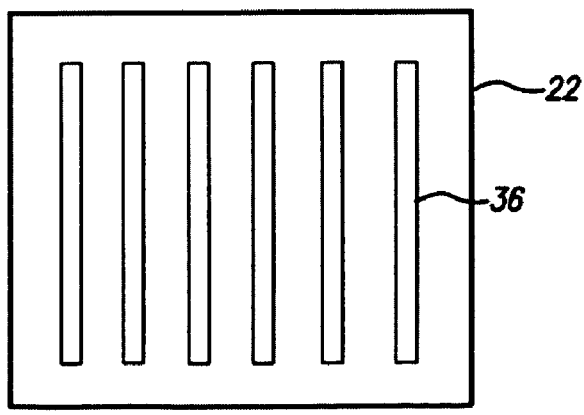
FIG. 5 is a top view of a mask according to an embodiment of the present invention.

While patterned deposition without a mask may be performed, such deposition may not have the resolution or accuracy, or speed desired. Hence, the use of a mask according to the present invention, may provide manufacturing advantages. A mask 22 having openings 36 is illustrated in FIG. 5.

Figure 6A:
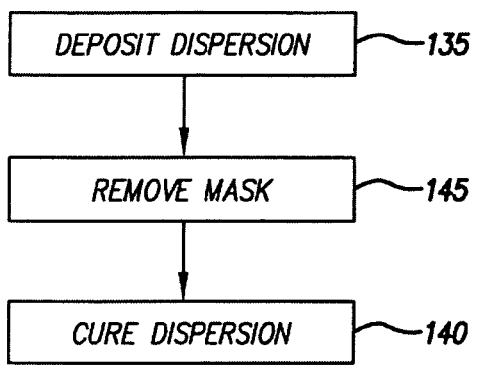
FIGS. 6a and 6b are flow diagrams showing alternative ordering of cure steps according to alternative embodiments of the present invention.
Figure 6B:
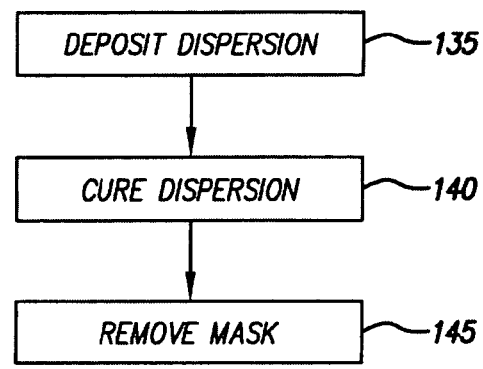
Figure 7:
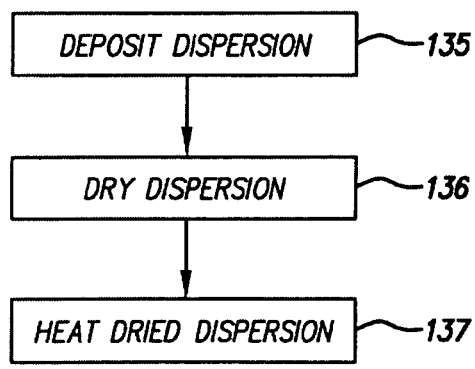
FIG. 7 is a flow diagram showing dispersion drying according to an embodiment of the present invention.

In one method according to an embodiment of the present invention illustrated in FIG. 6a and FIG. 3, the first mask 22 is removed 145 before the remaining, pattern-wise deposited dispersion 23 is cured 140 (for example by heat or light exposure). In an alternative embodiment, the deposited dispersion 23 is first cured 140 while the mask remains in place (FIG. 6b), afterwards the mask is removed 145. The latter technique (FIG. 6b) may provide improved resolution while the former technique (FIG. 6a) may avoid forming cured material on the mask. Referring to FIG. 7, the process of curing the dispersion 23 may comprise at least two steps. A first step may include drying the dispersion 136 (e.g. by evaporation with or without heating) and then heating the dried dispersion 137, for example to sinter the conductive precursor particles 26 into a conductive area 50 such as a bus or electrically conductive trace. Since the dried dispersion is patterned, the curing step may be patterned or unpatterned. Unpatterned processes such as baking the entire device or performing a flood exposure of the entire device to a curing light beam may be less expensive and faster but may suffer from exposing any environmentally sensitive layers to heat or light. Patterned processes such as exposure to a patterned laser beam may be and provide local higher temperatures but may avoid exposing environmentally sensitive layers to heat or light, but may be more expensive.

The method of the present invention may be employed multiple times to provide a variety of patterns. For example, some patterns (such as a two-dimensional grid) may not be readily formed in a mask. Hence, in an alternative embodiment of the present invention, an initial deposition with a first mask may be employed followed by a second deposition. The same mask may be used in a different orientation or a different mask may be employed. Alternatively, the same mask may be employed twice to disperse material into the same location and form thicker conductive areas, either with, or without, relocating the mask.

Hence, according to an embodiment of the present invention, a second mask may be located over the transparent electrode to expose second openings having locations over the transparent electrode different from the locations of the first openings, the dispersion may, again be over the second mask and through the second openings onto the transparent electrode, the second mask may be removed and, the dispersion cured to form second patterned conductive areas on the transparent electrode. The second mask may be different from the first mask, or the first mask may be re-employed in a different orientation. In an alternative embodiment of the present invention, the first mask may, or may not, be relocated over the transparent electrode and the dispersion cured to form conductive areas on the transparent electrode having a second thickness greater than the first thickness. In these embodiments, the steps 130 to 145 are essentially repeated.

Figure 8A:
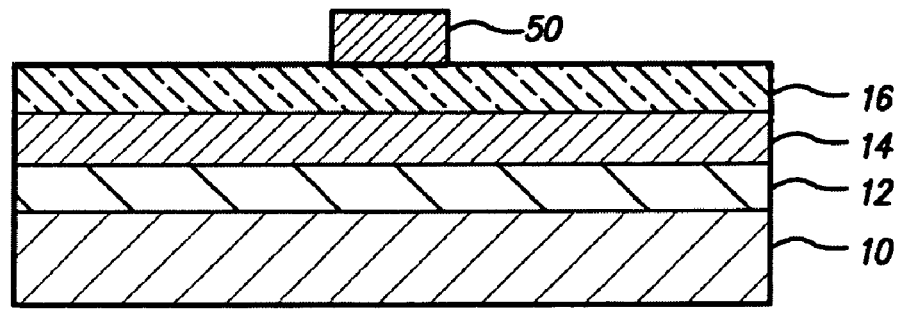
FIGS. 8a and 8b and 8c are partial cross sections showing alternative conductive areas according to alternative embodiments of the present invention.
Figure 8B:
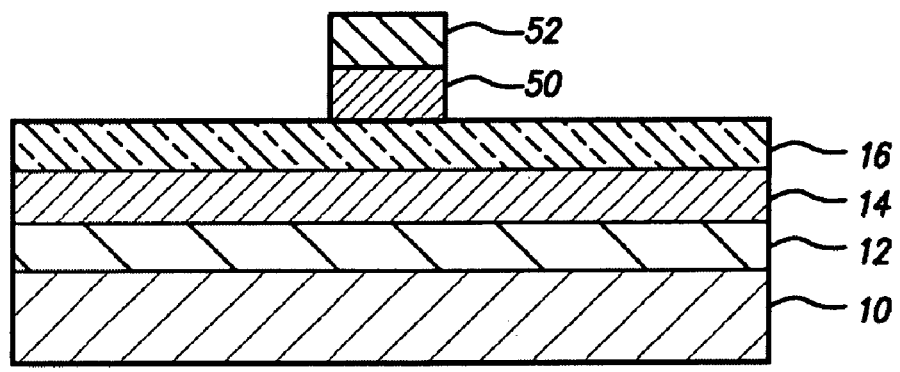
Figure 8C:
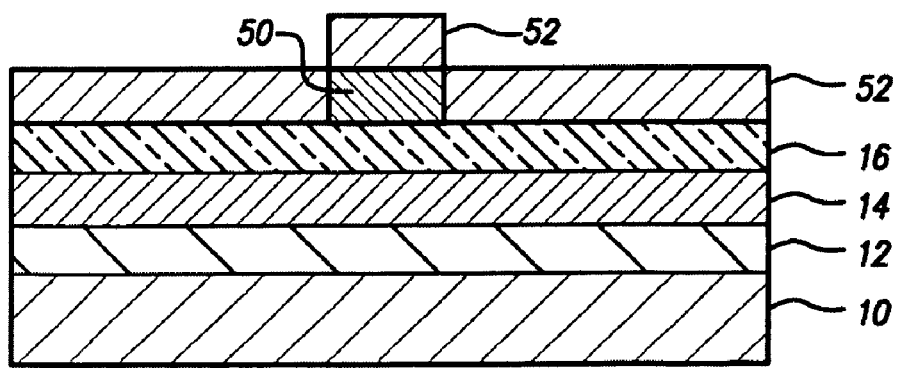
Figure 9:
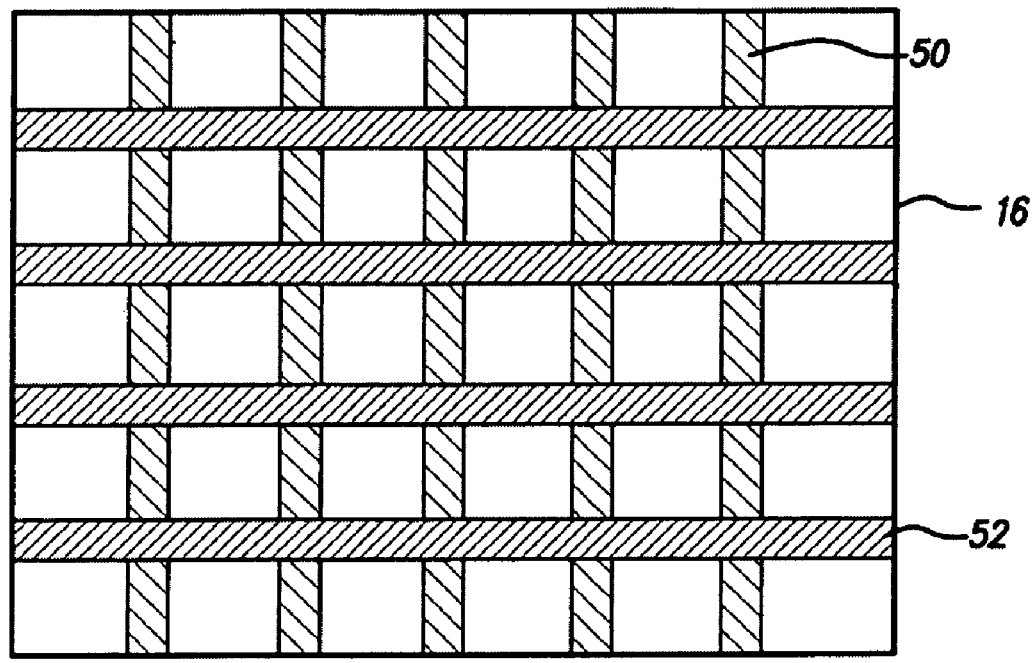
FIG. 9 is a top view of a transparent electrode having conductive areas according to an embodiment of the present invention.

Referring to FIG. 8a, a first conductive area 50 is formed according to the method of the present invention described above. In a subsequent step, as shown in FIG. 8b, the conductive area 52 is formed in the same location to provide a conductive area having an increased thickness. Alternatively, a second mask or the first mask (e.g. FIG. 5) rotated 90 degrees into an orthogonal orientation may be employed to form conductive areas 52 over a portion of conductive areas 50 (shown in cross section in FIG. 8*c* and in a top view in FIG. 9). Referring to FIG. 9, a transparent electrode 16 may be coated in two operations as described above to first form the conductive areas 50 and secondly to form the conductive areas 52.

Figure 10:
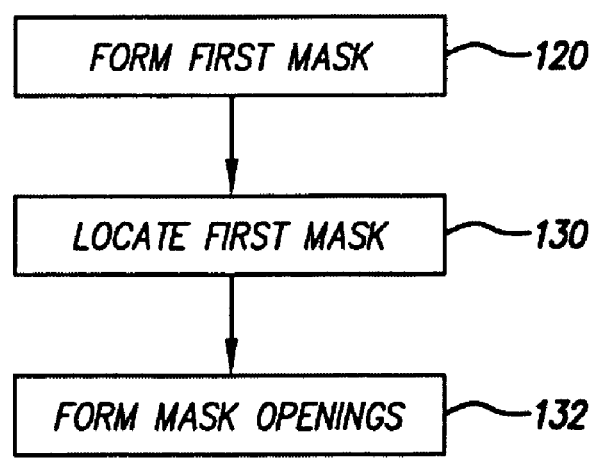
FIG. 10 is a flow diagram showing a method for forming openings in a mask according to an embodiment of the present invention.

In one embodiment of the present invention, the masks may be metal shadow masks, may be employed multiple times, and may be cleaned between uses. Alternatively, the masks may be used once and comprise, for example, a polymer or other organic film. In this latter embodiment, referring to FIG. 10, the mask openings may be formed 120 while the mask is located over the transparent electrode 16 by first forming 120 a mask without openings, locating 130 the holeless mask over the transparent electrode 16, and forming 132 the mask openings 36 (FIG. 5). In this fashion, the mask openings 36 may be more readily aligned with the substrate and LEDs formed thereon. Moreover, the masks may be very inexpensive and will not need expensive cleaning steps, since they can be disposable. Co-pending, commonly assigned U.S. application Ser. Nos. 11/676,323, 11/692,381, 11/736,115 and 11/735,539 describe single-use masks and are incorporated by reference in their entirety.

Figure 12:
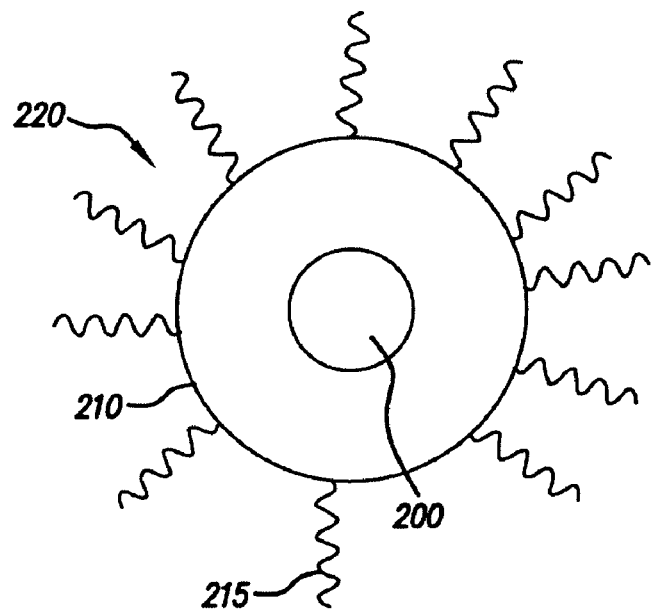
FIG. 12 is a cross section of a core/shell light-emitting nano-particle according to an embodiment of the present invention.
Figure 13:
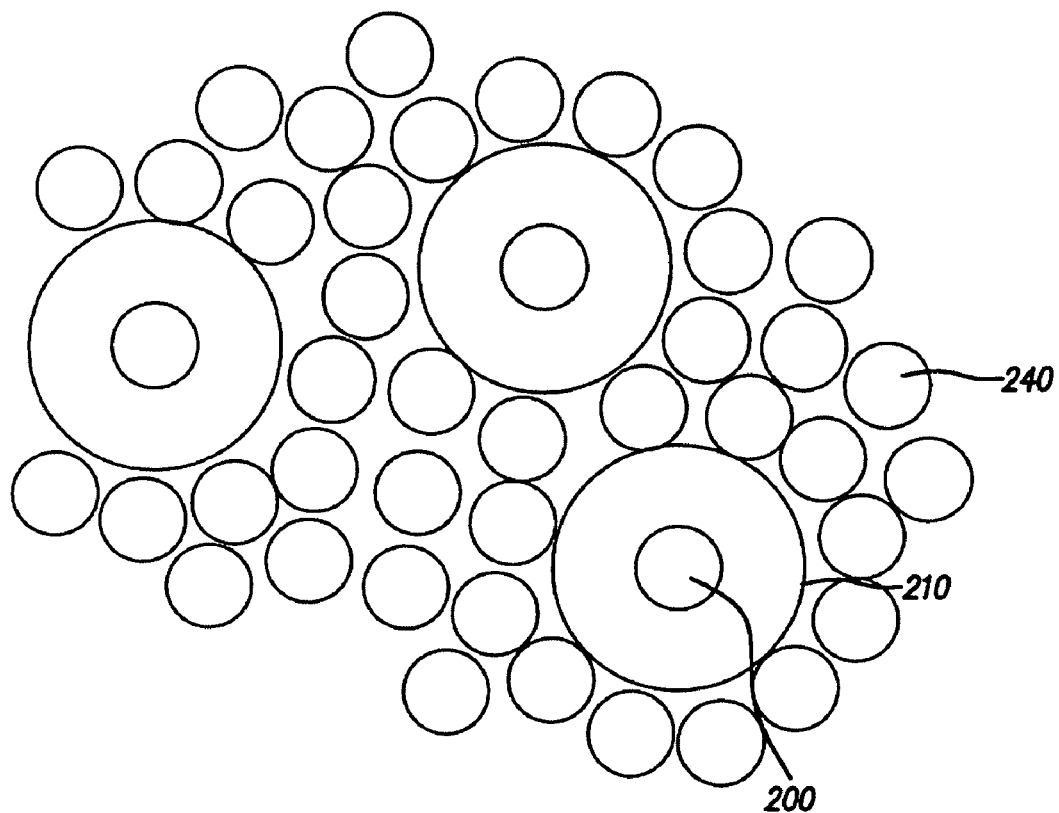
FIG. 13 is a cross section of a light-emitting layer including core/shell light-emitting nano-particles and conductive nano-particles according to an embodiment of the present invention.

The light-emissive layers may comprise organic materials, for example as taught in the OLED art or inorganic materials, for example core/shell quantum dots in a polycrystalline semiconductor matrix as shown in FIGS. 12 and 13. As shown in FIG. 12, a core/shell light-emitting nano-particle 220 may have a core 200 shell 210, and ligands 215. As shown in FIG. 13, the core/shell light-emitting nano-particles 220 may be combined with conductive nano-particles 240 in a semiconductor matrix to form a light-emitting layer 14, as described in co-pending, commonly assigned U.S. Ser. No. 11/226,622, which is hereby incorporated by reference in its entirety.

By employing patterned deposition through a mask, the present invention avoids the use of photolithographic techniques or cleaning techniques that may damage environmentally sensitive layers. Moreover, by employing a dispersion that is subsequently cured, for example by patterned exposure, the device need not be heated to a high temperature that can damage environmentally sensitive layers.

As employed in this disclosure, a sintering process is an annealing process and refers to the heating of a group of individual conductive particles with limited conductivity so that the particles cohere to form a single, more highly conductive structure. Essentially, small metal (preferably silver) particles are melted, or welded, together to form a conductive metal structure such as a conductive trace. Moreover, the sintering process will generally cause the cohered particles to adhere to the surface on which the cohered particles rest. Applicants have noted that, although the use of small metal nano-particles promotes some sintering at a relatively lower temperature (e.g. 120 C rather than 250C or higher), such sintering is incomplete unless conducted for a relatively long time (e.g. more than 10 minutes, more than 20 minutes, or even more than 30 minutes). According to the present invention, the nano-particles may be pattern-wise adhered to the transparent electrode 16 with a quick, relatively low-energy laser exposure (resulting in a temperature sufficient to cause adherence, but not complete sintering), the non-adhered particles removed, and the entire device then heated for a relatively longer time at a relatively low temperature to complete the sintering process. Because the low-temperature, relatively slow sintering process may be done in batch form without the use of patterning equipment, the present invention provides a lower-cost and more productive manufacturing method. Moreover, the use of relatively low-energy patterning equipment also improves manufacturing throughput and reduces costs.

According to the present invention, the metal nanoparticles may preferably have an average diameter of from 1-30 nanometers, more preferably of from 1-5 nanometers. Silver may be employed in the nano-particles as well as a mixture of metals.

The deposition of a transparent electrode by using conventional means such as sputtering may damage underlying organic layers in OLED embodiments of the present invention. Less damage to the underlying organic layers may be formed by reducing the energy of the sputtering process, or reducing temperatures, but a transparent electrode with a relatively lower conductivity will typically be obtained. The use of a patterned conductive area 50 in conjunction with such a reduced conductivity transparent electrode 16 can provide the necessary overall conductivity necessary for a given application while reducing damage to the organic layers.

A variety of means may be employed to coat the metal nano-particles over the LED. For example nanoparticles may be formed in a liquid suspension containing metal nano-particles using a solvent compatible with the transparent electrode (e.g. toluene, xylene, or cyclohexane). The liquid suspension may, or may not, include light-absorbing dyes and the LED may, or may not, include other light-absorbing layers. Such layers, for example, may be employed to enable selective light absorption and heating to enable localized curing, for example through exposure to a beam of light or a patterned beam of light. The liquid suspension may be deposited in a layer by any of several methods practiced in the microfabrication industry, including but not limited to spin coating, spray coating, hopper coating, meyer rod coating, gravure coating, offset printing, flexography, inkjet coating, dip coating, supercritical $CO_2$, vapor deposition, and plasma vacuum deposition. The liquid suspension may be heated above 20 degrees C. and less than or equal to 120 degrees C. to form a dried layer. Alternatively, the liquid suspension may be heated at less than or equal to 100 degrees C. In yet another alternative, the liquid suspension may be heated at less than or equal to 80 degrees C. Heating during the drying process should be limited to avoid sintering, and therefore adherence, of the unpatterned coating.

The LED device preferably may be heated after removal of the non-adhered metal nanoparticles to a temperature greater than that employed to heat the liquid suspension to form a dried layer, but it is still preferred to limit such heating step to a temperature that will minimize damage to the LED material components. For example, the LED device may be heated after removal of the non-adhered metal nanoparticles to a temperature less than or equal to about 150 degrees C. Alternatively, the LED device may be heated after removal of the non-adhered metal nanoparticles to a temperature less than or equal to about 120 degrees C. or to a temperature above 80 degrees C. In other embodiments, the LED device may be heated after removal of the non-adhered metal nanoparticles to a temperature from about 80 to about 150 degrees C. In general, applicants have discovered that over very long periods, for example months, metal nano-particles gradually adhere to an underlying surface, and even sinter, at room temperature. Nonetheless, because the coatings tend to cure, it is important to expeditiously pattern the layer so that the metal nano-particles may be easily removed from areas in which no additional conductive traces are desired. Hence, according to the present invention, the metal nanoparticles may be partially sintered when pattern-wise adhered to the second electrode, and further sintered when the LED device is heated after removal of the non-adhered metal nanoparticles to increase the conductivity of the pattern-wise adhered metal nanoparticles.

The substrate 10 could be any material suitable for forming an LED, including glass, a silicon wafer, a metal such as stainless steel, and the like. Flexible supports could be used as well, including polyethylene terephthalate, polyethylene, polypropylene, polyethylene naphthalate, polysulphone, polyimides, and the like. Alternatively, the substrate 10 can be any preliminary substructure of a final device, which may include functional layers, registration marks for alignment, as for example the various layers of a thin film transistor array backplane for LCDs or OLED displays.

The present invention may be employed in LED devices having only a single first and second electrode and emissive area. Alternatively, a plurality of light-emissive areas may be formed by patterning an electrode, for example the transparent or the reflective electrode as shown in FIG. 11. The patterned conductive areas may be between light-emissive areas or within them. A black matrix may be provided between the light-emissive areas or over the patterned conductive areas. Applicants have demonstrated that the provision of sintered nano-particle conductors to form patterned conductive areas over a transparent electrode improves the conductivity of the electrode. Patterned conductive areas between light-emitting areas may, for example, have a width of 20-50 microns depending on the LED design, while patterned conductive areas in the light-emitting areas 24, if employed, may be less than 20 microns, preferably less than 10 microns, and may be 5 microns wide. Applicants have demonstrated the formation of such patterned nano-particle conductors at widths of 5 microns.

In yet a further embodiment of the present invention, the patterned conductive areas 50 may be directly connected to an external power or ground buss 19. By directly connecting the patterned conductive areas 50 to an external power or ground buss, the overall resistance of a transparent electrode is reduced.

Lasers, such as ultraviolet or infrared lasers, may be employed to locally pattern-wise adhere the nano-particles. Preferably, the pattern is provided by a modulated laser beam or an array of such beams. The laser radiation may pattern-wise expose the dried suspension by employing a variety of means, for example, a drum print or an x-y stage with a laser of an appropriate wavelength. This laser can be directly modulated via current to the laser or may be modulated by a spatial light modulator such as an acousto-optic modulator.

Although, according to the present invention, less heat is necessary to adhere the nano-particles than to fully sinter them, radiation-absorbing material can be employed in the suspension to improve heat absorption by the dried suspension and can be a light-absorbing component (for example IR or UV dyes such as the dyes specified in commonly assigned U.S. Pat. Nos. 4,973,572 to DeBoer and 5,578,416 to Tutt, a pigment such as carbon black, or light-absorbing metal particles) whose spectrum matches the spectrum of the laser may be included to absorb radiation to produce heat which causes adhesion of the metal nanoparticles. However, because of the superior performance of the nano-particulate suspension described below, for some embodiments the light-absorbing components may not be required. When employed with a laser, the efficiency of the heating is well known to depend on the laser fluence, spot size, beam overlap and other factors.

In a further embodiment of the present invention illustrated in FIG. 8b, the patterned conductor may be formed in two steps that may be identical. Applicants have discovered that the thickness of the conductors formed by heating the silver nano-particles can be very thin, for example less than 100 nm. While this effectively reduces the resistance of the transparent electrode 16, further improvements may be made by forming a second layer of identically-patterned conductors, thereby doubling the thickness and the conductivity of the patterned conductor 16. Any of the processes described above may be employed for either forming the first 50 or second 52 layer of conductive area. Since both layers are formed in the same location, no additional area is required in the LED device so that other performance attributes are unaffected.

Applicants have discovered through experimentation that the use of silver nano-particles having a mean major axis diameter of approximately equal to or less than 5 nm improves the adhesion and sintering of the particles to form a conductor at lower temperatures and with equivalent conductivity. Such particles may sinter to form useful conductors at temperatures equal to or less than 120-130 degrees.

Figure 14:
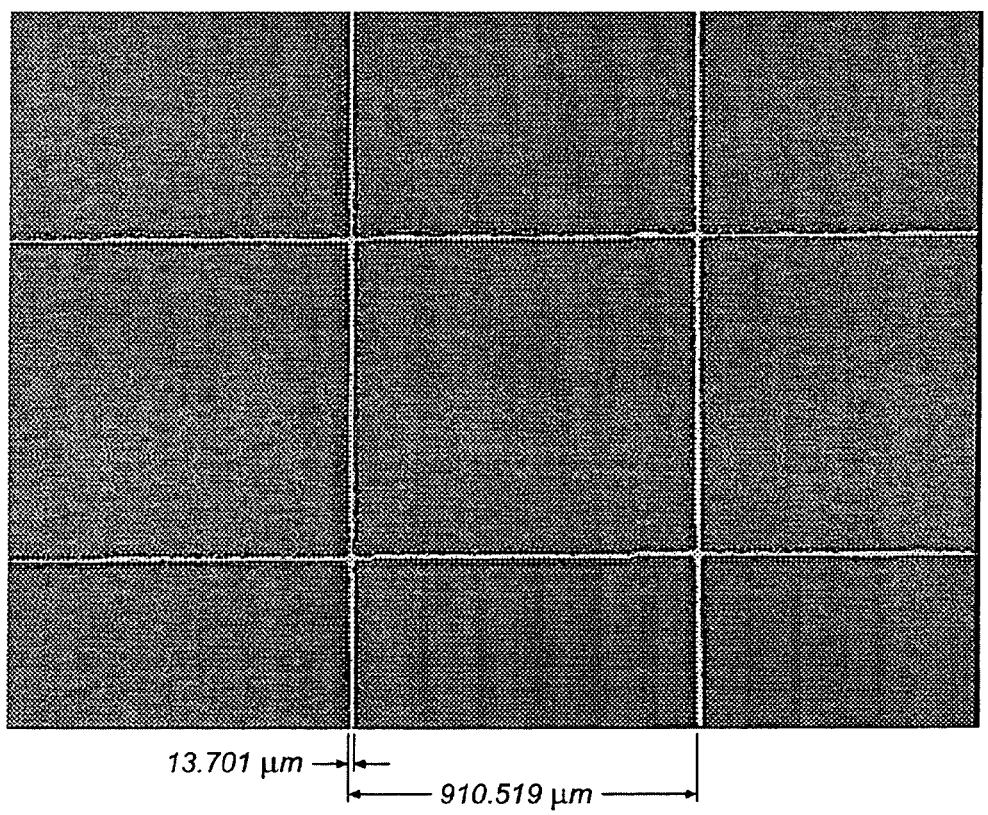
FIG. 14 is a photomicrograph of conductive areas on an ITO transparent electrode according to an embodiment of the present invention.

FIG. 14 is a photo-micrograph of nano-particle conductors formed on an ITO transparent conductor by coating a layer of metal nanoparticles over the transparent conductor, pattern-wise adhering the metal nanoparticles to the transparent conductor, removing non-adhered metal nanoparticles from the transparent conductor, and heating the OLED device after removal of the non-adhered metal nanoparticles to increase the conductivity of the pattern-wise adhered metal nanoparticles. The conductors are formed to be 20 microns wide in both dimensions and on a 174-micron pitch. These sizes are chosen to be suitable for pixilated, top-emitting OLED devices. The resistance of the combination is measured by a standard four-point probe at 5.46 ohms per square. Top-emitting LED devices using conventional ITO deposition processes are expected to have a resistance of 50-100 ohms per square. In a second experiment, patterned conductive areas 50 are patterned on 170-micron centers over an ITO transparent conductor 16. Approximately 8-micron wide patterned conductors are also formed in one direction and the resistance of the coating is reduced from 5.46 to 4.95 ohms/square.

In further embodiments of the present invention, optically active structures may be formed by the patterned conductive areas 50 in the light-emitting areas 24. For example, wire-grid polarizers, diffractors, and reflectors may be formed.

The carrier liquid comprising the liquid dispersion should not degrade LED performance by outgassing harmful materials, corroding the patterned conductive layer or contaminating the LED. For example, cyclohexane, cyclopentane, xylene, or toluene may be used.

The patterned nano-particle conductive areas 50 are formed over the transparent electrode 16 and are more conductive than the transparent electrode 16, thereby improving the distribution of power to the LED 11 by reducing the sheet resistivity of transparent electrode 16 across the device as well as reducing the resistive heating and voltage drop in the transparent electrode 16. Moreover, the nano-particle conductor may serve to conduct heat itself, thereby improving the lifetime of the organic materials in the OLED. The nano-particles can comprise any conductive material that can be suitable formed into sinterable nano-particles but are preferably metal, and more preferably silver.

The patterned nano-particle conductive areas 50 may usefully separate the LED 11 from the cover 20 and provide space for useful optical structures, including a low-index gap as taught in co-pending, commonly assigned U.S. Ser. Nos. 11/065,082 filed Feb. 24, 2005 and 11/241,370 filed Sep. 30, 2005, the disclosures of which are hereby incorporated in their entirety by reference. As discussed above and claimed herein, multiple layers of such liquid dispersions may be cured to form thicker conductors. Alternatively, the liquid suspension may include spacer particles larger than the metal nano-particles to separate the cover 20 from the LED 11. The use of spacer particles is taught in co-pending, commonly assigned U.S. Ser. No. 11/179,409 filed Jul. 12, 2005, the disclosure of which is hereby incorporated in its entirety by reference.

Since, according to the present invention the dispersion is patterned over the substrate through the mask, pattern-wise exposure and curing is not necessary. However, according to an embodiment of the present invention, such pattern-wise curing may reduce exposure of other areas of the device to potentially harmful radiation or heat. Hence, pattern-wise curing may be employed, for example, by a laser-based pattern-wise exposure system.

Pattern-Wise Exposure System

In one embodiment of the present invention, a laser system may be employed to adhere metal nano-particles that consists of a non-coherent infrared diode laser bar at 808 nm (+/−10 nm) whose beam is divided into 256 separate addressable channels modulated by a spatial light modulator at 5-micron intervals across the beam's width, as described in U.S. Patent Application Publication No. 2005/0266172 (Kay et al.), which is incorporated by reference. The beam intensity distribution in the fast scan direction is a Gaussian whose 1/e2 diameter value is 3.6 micrometers. Peak-to-peak distance in the fast-scan direction was limited by the modulation scheme to 5 microns for the examples of this invention yielding a minimum ablated spot at the film plane of about 5 microns maximum representing 1 pixel in any image rendition. The beam may be scanned across the surface by a two-axis movable stage that holds the substrate. Exposure occurs as the fast-scan axis movable stage ran at speeds between 1.0 and 0.1 meter per second. The powers available on this laser system were between 11 and 55 milliwatts per channel corresponding to a total exposure range of between 0.22 and 11 J/cm2, although the powers and exposures useful for this invention are not limited to these ranges. The slow-scan axis movable stage increments the sample a set distance in preparation for another fast scan motion. This sequence continues until the total desired area is exposed.

The substrate may be held against the stage by a vacuum, although those skilled in the art will recognize that many other means exist for affixing the substrate to the stage, for example by clamping, application of pressure, adhesives, with optional heating of the substrate or the like, and including means for accurate placement and registration of the substrate with respect to the ablative pattern. One example of a fixture for this positioning is disclosed in commonly-assigned U.S. Pat. No. 6,695,029 (Phillips et al.), the disclosure of which is hereby incorporated by reference. It is preferred that transfer take place under powers available were between 11 and 55 milliwatts per channel corresponding to a total exposure range of between 0.4 and 11 J/cm2. The movable stage can support a substrate oriented either with the suspension-side face towards or away from the laser source when working with transparent substrates 10. The pattern information is provided by means of a CPU and a RIP capable of processing test patterns.

Any infrared or visible YAG laser system could be used in conjunction with this invention, which is not limited to the laser system described above. The array of lasers could be an assembly of discrete diodes as in the Kodak Approval Digital Proofing System™, or bar laser with a segmented light modulator as in the Kodak Newsletter™ or the Creo Trendsetter Plate Writer-Proofers™. The device for transporting the substrate 10 could be a flatbed for rigid substrates and relative motion could be provided by moving either the laser array or the support stage. Drum systems utilizing flexible supports could also be considered, as well as laser arrays mounted in the suitable proximity for a moving web of substrate 10. There is no limitation to the number of addressable channels or lasers comprising the array, other than the practical limits of the devices themselves, and the ability or the CPU to deliver the information at the appropriate rate. More than one head could be employed simultaneously.

Modulation of the laser power on the plane of dried suspension to produce the desired adhesion pattern could be accomplished by any means known if the art, such as binary exposure in the on or off mode as practiced in the laser system of this invention, or by pulse width modulation. The only requirement is that the power in the on mode be sufficient to cause ablation at the scan speed chosen.

Alternatively, pattern-wise radiation may be supplied through a mask to the dried suspension from any non-laser source such as a Xenon flash, or any other radiation source with a high enough intensity at the absorptive wavelengths of the thermal suspension to suitably adhere the metal nano-particles.

Light to-Heat-Converting Substance

Although the present invention does not require the use of additional dyes, dyes may be employed to reduce exposure time. IR absorbing dyes included in this invention are specified in commonly assigned U.S. Pat. Nos. 4,973,572 (DeBoer) and 5,578,416 (Tutt), or described in "Infrared Absorbing Dyes" (ed. Masaru Matsuoka, Plenum Press, 1990). Dye types useful for this invention include, but are not limited to, Cyanines, Squaryliums, Croconiums, Pyryliums, Quinones, Phthalocyanines and their metal complexes, Naphthalocyanines and their metal complexes, azo dyes, and Intermolecular Charge Transfer Complexes. Those skilled in the art will recognize that the radiation absorbing chromophores or this invention can be presented to the dried suspension as either monomolecular dyes or as pigment particles depending on the particular properties of the absorber, which may also include a carbon black, a metal nanoparticle, or a carbon nanotube. Other radiation absorbers useful for this invention are metals or inorganic materials such as chromium, nickel, titanium, molybdenum, tungsten, zirconium, alloys such as NiCr, MoCr, WTi, and the like, oxygen-deficient oxides of metals such as aluminum or chromium oxides and the like, or a layered stack of materials that absorb radiation by virtue of their antireflection properties. The main criteria is that radiation-absorbing substance absorb laser light at the given wavelength of the pattern-wise radiation, at a high enough extinction for local heating of the dried suspension to promote adhesion. The efficiency of this transfer is well known to depend on the laser fluence, spot size, beam overlap and other factors. Generally, the optical density of radiation-absorbing material should be at least 0.1 (20% of the light is absorbed).

The radiation absorbers may be present in the dried suspension as a monomolecular species dissolved in the organic binder of said suspension. Alternatively, the radiation absorbing substances can be applied to the dried suspension in a variety of methods known in the art, such as but not limited to, spin coating, spray coating, hopper coating, gravure, offset printing, flexography, ink jet deposition, supercritical $CO_2$, and the like, from a suspension that may or may not include a binder material. Other methods of application include vacuum or vapor deposition.

Nano-Particles

The nano-particles can be any metal or semimetal which can be made to form nanoparticles and are dispersable in a solvent. The main criterion for choosing a solvent for the nanoparticles is that the solvent be compatible with underlying layers of the OLED device. For example, cyclohexane, cyclopentane, xylene, or toluene may be employed.

Examples of metals which may be used to form nanoparticles include, but are not limited to: silver, gold, and nickel. The nanoparticles may also be formed as a mixture or two or more metals, for example as an alloy or as a core shell particle wherein one metal is the core and another surrounds the outside.

The nanoparticles are small enough that the temperatures to melt them have been reduced. In many case the temperatures are hundreds of degrees below the pure materials. To allow good adhesion or sintering, all that is typically necessary is to heat the nano-particles at the preferred temperature.

The nanoparticles are typically stabilized with an organic shell that allows dispersal in solvent and stabilization to spontaneous sintering. The organic coating is selected for optimal thermal stabilization, low temperature adhesion and sintering, and desired solvent dispersal. Upon heating, the organic coating is typically released.

A preferred embodiment is silver nanoparticles formed with a dodecylamine shell dispersed in cyclohexane. The dodecylamine binds moderately to the silver nanoparticles allowing stable dispersement in cyclohexane.

The nanoparticles are porous and have low cohesive strength. The cohesive forces or the nanoparticles are small and unlike pure metal coatings will not tend to bridge gaps and instead "tear" cleanly, allowing good edge definition.

In the final step, heating of the nano-particles causes melting or sintering to coalesce the nanoparticles and thereby increase the conductivity. The heating can be conducted by any means that raises the temperature above the sintering temperature. Example methods include but are not limited to oven heating, hot plates, radiant heaters, thermal conduction, hot air, microwave, or photothermal.

Ag(0) Nanoparticle Dispersion Preparation 81 of cyclohexane/68 g of silver acetate/740 g of dodecylamine was added to a 22-liter, 3-neck, round reaction flask equipped with a stir rod, cold water condenser and an addition funnel containing 21 of cyclohexane/44 g of phenylhydrazine/100 ml toluene. After dissolving all silver acetate in suspension, added chemicals in addition funnel dropwise to the reaction flask. The mixture was stirred at 60° C. for 1 hour before being cooled down to room temperature. Subsequently, 21 of acetone was added. The dispersion was concentrated via vacuum evaporation at 45° C. To the resulting concentrated reaction mixture was added 101 g of 50/50 methanol/acetone to precipitate the silver nanoparticles with yield of 48.81 g. The Ag(0) nanoparticles dispersion was made by dissolving the silver nanoparticles in cyclohexane to obtain a 10% by weight suspension. Average particle size of the nanoparticles was approximately 4 nm.

In alternative further embodiments of the present invention, a scattering layer may be optically integrated with the electrodes 12 and 16 respectively and the light-emissive layers 14. As described in co-pending, commonly assigned U.S. Ser. No. 11/065,082, filed Feb. 24, 2005, the disclosure of which is hereby incorporated by reference, light emitted by the organic layers of an OLED may be trapped within the OLED device and a scattering layer may be employed to scatter the trapped light out of the OLED device. As employed herein, a light scattering layer is an optical layer that tends to randomly redirect any light that impinges on the layer from any direction. Optically integrated means that light emitted by the light-emissive layers encounters the scattering layer before traveling through other layers having an optical index lower than those of the organic materials or electrodes.

A color filter may be located over the entire extent of the transparent electrode 16. The color filter may be formed on a scattering layer, if present, or on a transparent electrode or any protective or encapsulating layers formed on a transparent electrode or formed on the cover or substrate of a top-emitting or bottom-emitting LED device, respectively. In this case, both emitted and ambient light that is reflected within the LED device may pass through the filter multiple times.

Although LED layer structures have been primarily described with a cathode on the top and an anode on the bottom near the substrate, it is well known that the organic layers can be inverted and the positions of the anode and cathode exchanged. Both such structures are included in the present invention.

Various conductive and scattering materials useful in the present invention, as well as the employment of scattering layers for extracting additional light from the device are further described in co-pending, commonly assigned U.S. Ser. No. 11/065,082, filed Feb. 24, 2005, incorporated by reference above. Additional layers may be usefully employed with the present invention. For example, one problem that may be encountered with scattering layers is that the electrodes may tend to fail open at sharp edges associated with the scattering elements in the scattering layer. Although the scattering layer may be planarized, typically such planarizing operations do not form a perfectly smooth, defect-free surface. To reduce the possibility of shorts between the transparent electrodes, a short-reduction layer may be employed over a scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Light-emissive LED devices employing organic materials may be sensitive to moisture or oxygen, or both, particularly if formed with organic materials, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as SiO$_x$ (x>1), Teflon, and alternating inorganic/polymeric layers are known in the art for encapsulation. Atomic layer deposition may be employed to provide encapsulation, for example as described in copending, commonly assigned U.S. Ser. No. 11/122,295, filed Apr. 5, 2005, the disclosure of which is incorporated by reference herein. These encapsulation layers may be formed over the transparent electrode either under or over any of the scattering layers or color filter layers. For example, a protective layer, for example an encapsulating layer formed by atomic layer deposition and/or a layer of parylene, may be formed over transparent electrode 16.

The present invention may also be employed with four-sub-pixel display designs for example, having a red, green, blue, and white emitter. A neutral density filter may be located over any of the emitters, but in particular may be employed with a white emitter to improve device contrast. Such color or neutral density filters may be located in any of the transparent openings taught herein.

LED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may be practiced with either active- or passive-matrix LED devices. It may also be employed in display devices or in area illumination devices. In a preferred embodiment, the present invention is employed in a flat-panel OLED device composed of small molecule or polymeric OLEDs, or employing inorganic emitters such as core/shell quantum dots as disclosed in but not limited to U.S. Pat. No. 4,769,292, issued Sep. 6, 1988 to Tang et al., and U.S. Pat. No. 5,061,569, issued Oct. 29, 1991 to VanSlyke et al, and Kahen reference. Many combinations and variations of light-emitting materials can be used to fabricate such a device, including both active- and passive-matrix LED displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
11 light-emitting diode
12 electrode
14 light-emissive layer(s)
16 transparent electrode
19 gap
20 cover
22 mask
23 dispersion
24 light-emissive area
26 conductive precursor particles
30 thin-film circuitry
32 insulator
34 insulator
36 mask opening
40 spray device
42 inkjet device
44 laser device
50 conductive patterned area
52 conductive patterned area
70 auxiliary electrode
100 form first electrode operation
105 form light-emitting layer operation
110 form transparent electrode operation
120 form first mask operation
125 form dispersion operation
130 locate mask operation
132 form mask openings operation
135 deposit dispersion operation
136 dry dispersions operation
137 heat dried dispersion operation
140 cure dispersion operation
145 remove mask operation
200 core
210 shell
215 ligand
220 core/shell quantum dot
240 conductive nano-particle

The invention claimed is:

1. A method for improving current distribution of a transparent electrode, comprising the steps of:
   a) forming a transparent electrode over a substrate;
   b1) forming a first mask;
   b2) forming a plurality of first openings in the first mask;
   c) locating the first mask over the transparent electrode;
   d) forming a dispersion including conductive precursor components;
   e) depositing the dispersion over the first mask and through the first openings onto the transparent electrode;
   f) removing the first mask; and
   g) curing the conductive precursor components of the dispersion to form first patterned conductive areas having a first thickness on the transparent electrode.

2. The method of claim 1, further comprising the steps of:
   h) locating a second mask over the transparent electrode to expose second openings over the transparent electrode differently located than the first openings;
   i) depositing the dispersion over the second mask and through the second openings onto the transparent electrode;
   j) removing the second mask; and
   k) curing the dispersion to form second patterned conductive areas on the transparent electrode.

3. The method of claim 1, further comprising the steps of:
   h) re-positioning the first mask over the transparent electrode;
   i) depositing the dispersion over the first mask and through the first openings onto the transparent electrode;
   j) removing the first mask; and
   k) curing the dispersion to form a third patterned conductive areas on the transparent electrode.

4. The method of claim 1, further comprising the steps of:
   h) depositing the dispersion again over the first mask and through the first openings onto the transparent electrode; and
   i) curing the dispersion to form first patterned conductive areas on the transparent electrode having a second thickness greater than the first thickness.

5. The method of claim 1, wherein the dispersion is deposited over the first mask.

6. The method of claim 1, wherein the dispersion is deposited over the first openings and environs of the first openings.

7. The method of claim 1, wherein the dispersion is deposited using hopper, slide, inkjet, or spray deposition.

8. The method of claim 1, further comprising the steps of forming an additional electrode and a light-emissive layer between the additional electrode and the transparent electrode.

9. The method of claim 8, wherein the light-emissive layer comprises inorganic materials.

10. The method of claim 9, wherein the inorganic materials include core/shell quantum dots in a polycrystalline semiconductor matrix.

11. The method of claim 8, wherein the light-emissive layer comprises organic materials.

12. The method of claim 1, wherein the dispersion is cured by exposure to heat or light.

13. The method of claim 1, wherein the dispersion is cured by pattern-wise exposure to a laser beam.

14. The method of claim 1, wherein the dispersion is cured by exposure to an unpatterned beam of light.

15. The method of claim 1, wherein the dispersion is repetitively deposited through the first mask.

16. The method of claim 1, wherein the mask is a metal mask or a polymer mask.

17. The method of claim 1, wherein the openings in the first mask are formed after locating the mask over the transparent electrode.

18. The method of claim 1, wherein the dispersion is cured in the openings before the first mask is removed.

19. The method of claim 1, wherein the openings in the mask are patterned by ablating or melting portions of the mask with laser light.

20. The method of claim 1, wherein the precursor components of the dispersion include nanoparticles of a conductive material.

* * * * *